(12) United States Patent  
Priewasser

(10) Patent No.: US 9,006,085 B2
(45) Date of Patent: Apr. 14, 2015

(54) ADHESIVE AND PROTECTIVE MEMBER USED IN A WAFER PROCESSING METHOD

(71) Applicant: Disco Corporation, Tokyo (JP)

(72) Inventor: Karl Heinz Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/029,162

(22) Filed: Sep. 17, 2013

(65) Prior Publication Data

US 2014/0084423 A1    Mar. 27, 2014

(30) Foreign Application Priority Data

Sep. 27, 2012 (JP) ................................. 2012-214123

(51) Int. Cl.
| | | |
|---|---|---|
| H01L 21/30 | (2006.01) | |
| H01L 21/46 | (2006.01) | |
| H01L 21/28 | (2006.01) | |
| H01L 21/44 | (2006.01) | |
| H01L 21/3205 | (2006.01) | |
| H01L 21/4763 | (2006.01) | |
| H01L 29/06 | (2006.01) | |
| H01L 21/78 | (2006.01) | |

(52) U.S. Cl.
CPC ............... *H01L 29/06* (2013.01); *H01L 21/78* (2013.01); *Y10S 438/977* (2013.01)

(58) Field of Classification Search
USPC .................. 438/459, 589, 576, 977; 257/619
See application file for complete search history.

(56) References Cited

U.S. PATENT DOCUMENTS

| | | | |
|---|---|---|---|
| 2011/0097874 A1* | 4/2011 | Broekaart et al. ............ 438/459 |
| 2011/0256665 A1* | 10/2011 | Kawai et al. .................. 438/109 |

FOREIGN PATENT DOCUMENTS

| | | |
|---|---|---|
| JP | 05-198542 | 8/1993 |
| JP | 2004-207606 | 7/2004 |

* cited by examiner

*Primary Examiner* — A. Sefer
*Assistant Examiner* — Dilinh Nguyen
(74) *Attorney, Agent, or Firm* — Greer, Burns & Crain Ltd.

(57) ABSTRACT

A wafer processing method including a fixing step of providing a wafer on a protective member so that a device area of the wafer faces an unevenness absorbing member provided in a recess of the protective member and providing an adhesive outside the device area to thereby fix the protective member and the wafer, a grinding step of holding the protective member on a holding table in the condition where the back side of the wafer is exposed and next grinding the back side of the wafer by using a grinding unit to thereby reduce the thickness of the wafer to a predetermined thickness, and a removing step of removing the protective member from the wafer. The adhesive is locally provided outside of the device area, so that the protective member can be easily removed from the wafer without leaving the adhesive on the front side of each device.

2 Claims, 8 Drawing Sheets

ADHESIVE AND PROTECTIVE MEMBER USED IN A WAFER PROCESSING METHOD

BACKGROUND OF THE INVENTION

1. Field of the Invention

The present invention relates to a protective member for protecting the front side of a wafer such as a semiconductor wafer and also to a wafer processing method using the protective member, such as grinding of the wafer.

2. Description of the Related Art

In a semiconductor device fabrication process, a plurality of devices having electronic circuits are formed on the front side of a semiconductor wafer, and the back side of the semiconductor wafer is ground to reduce the thickness of the semiconductor wafer. Thereafter, the semiconductor wafer is divided into the individual devices. In general, back grinding of the wafer is performed by a method including the steps of holding the wafer on a holding table in the condition where the back side of the wafer is exposed and next grinding the back side of the wafer held on the holding table by using abrasive members of grinding means. If the front side of the wafer comes into direct contact with the holding table in performing this method, the devices formed on the front side of the wafer may be damaged. Therefore, a protective member is attached to the front side of the wafer to protect the devices prior to holding the wafer on the holding table.

Examples of the protective member known in the art include a protective tape disclosed in Japanese Patent Laid-open No. Hei 05-198542 and a wafer support system disclosed in Japanese Patent Laid-open No. 2004-207606. The protective tape is composed of a base sheet and an adhesive layer formed on one side of the base sheet. The protective tape is attached through its adhesive layer to the front side of the wafer. On the other hand, the wafer support system is usually attached to the wafer by using an adhesive.

SUMMARY OF THE INVENTION

After performing the back grinding of the wafer, the protective member is peeled from the wafer, and the wafer is next subjected to a dividing step. For example, in the case of cutting the wafer from the front side thereof by using a cutting blade to thereby divide the wafer into the individual devices, a dicing tape for handling the wafer is attached to the back side of the wafer and the protective member is peeled from the front side of the wafer. However, it is difficult to peel the protective member from the front side of the wafer reduced in thickness by the grinding without damage to the wafer. In particular, there are recent tendencies to further increase the size of the wafer and further reduce the finished thickness of the wafer, so that the difficulty in peeling the protective member becomes remarkable. Further, there is another problem such that a paste or adhesive is left on the front side of each device after peeling the protective member from the wafer.

It is therefore an object of the present invention to provide a protective member which can be easily peeled from the front side of a wafer without leaving a paste or adhesive on the front side of each device. It is another object of the present invention to provide a wafer processing method using this protective member.

In accordance with an aspect of the present invention, there is provided a protective member for protecting the front side of a wafer having a device area where a plurality of devices are formed and a peripheral marginal area surrounding the device area, the protective member including a circular base having a diameter greater than or equal to the diameter of the wafer, the front side of the circular base being formed with a recess larger in size than the device area and smaller in size than the wafer; and an unevenness absorbing member provided in the recess.

In accordance with another aspect of the present invention, there is provided a wafer processing method of processing a wafer by using a protective member, the front side of the wafer having a device area where a plurality of devices are formed and a peripheral marginal area surrounding the device area, the protective member including a circular base having a diameter greater than or equal to the diameter of the wafer, the front side of the circular base being formed with a recess larger in size than the device area and smaller in size than the wafer, and an unevenness absorbing member provided in the recess, the wafer processing method including a fixing step of providing the wafer on the protective member so that the device area of the wafer faces the unevenness absorbing member of the protective member and providing an adhesive outside the device area to thereby fix the protective member and the wafer; a grinding step of holding the protective member on a holding table in the condition where the back side of the wafer is exposed after performing the fixing step, and next grinding the back side of the wafer by using grinding means to thereby reduce the thickness of the wafer to a predetermined thickness; and a removing step of removing the protective member from the wafer after performing the grinding step.

According to the present invention, the adhesive is locally provided outside of the device area to fix the protective member and the wafer. Accordingly, after grinding the back side of the wafer, the protective member can be easily removed from the wafer. Furthermore, the adhesive is not left on the front side of each device after removing the protective member.

Preferably, the adhesive has a property such that its adhesive strength is reduced by an external stimulus; and the removing step includes the steps of applying the external stimulus to the adhesive to thereby reduce the adhesive strength of the adhesive and next removing the protective member from the wafer. Preferably, the removing step includes the steps of completely cutting at least the wafer along the boundary between the device area and the adhesive and next removing the protective member from the wafer.

According to the present invention, it is possible to provide a protective member which can be easily removed from a wafer without leaving a paste or adhesive on the front side of each device. It is also possible to provide a wafer processing method using this protective member.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described with reference to the drawings.

(1) Wafer

Figure 1A:
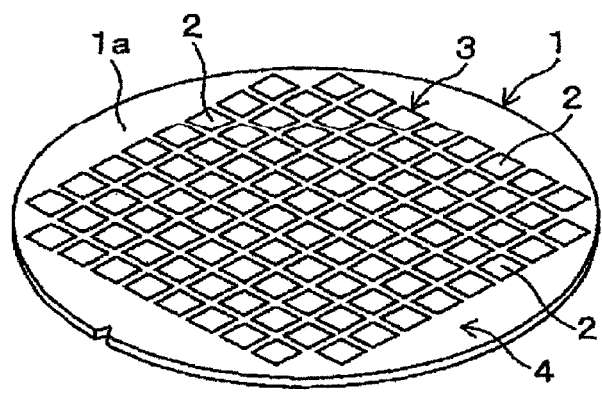
FIG. 1A is a perspective view of a wafer according to a preferred embodiment of the present invention.

FIG. 1A is a perspective view of a wafer 1 such as a semiconductor wafer according to the preferred embodiment. The wafer 1 has a given thickness of about 700 µm, for example. A plurality of devices 2 are formed on the front side 1a of the wafer 1. A plurality of crossing division lines are set on the front side 1a of the wafer 1 to thereby partition a plurality of rectangular regions, and a plurality of electronic circuits such as LSIs are respectively formed in these rectangular regions, thereby forming the plural devices 2.

Figure 1B:
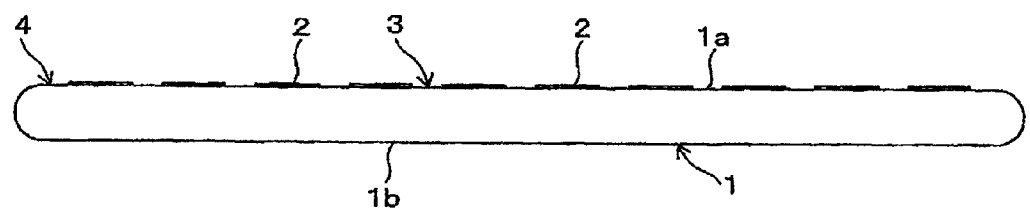
FIG. 1B is a side view of the wafer shown in FIG. 1A.

These devices 2 are formed in a device area 3 as an area occupying a large part of the front side 1a except its peripheral area. The device area 3 is a circular area concentric with the outer circumference of the wafer 1. The front side 1a of the wafer 1 further has a substantially annular peripheral marginal area 4 surrounding the device area 3. That is, the devices 2 are not formed in the peripheral marginal area 4. As shown in FIG. 1B, each device 2 slightly projects from the front side 1a of the wafer 1, so that the front side 1a of the wafer 1 is formed as an uneven surface.

(2) Protective Member

Figure 2A:
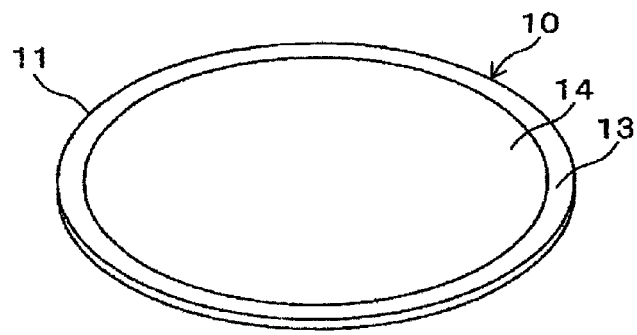
FIG. 2A is a perspective view of a protective member according to the preferred embodiment.
Figure 2B:
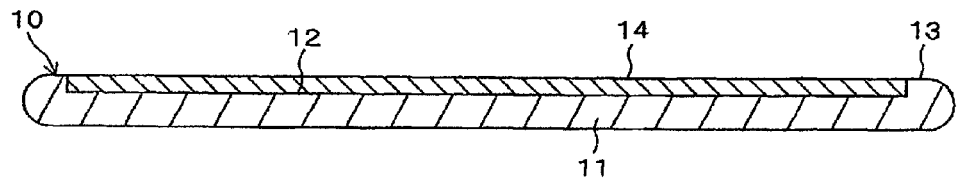
FIG. 2B is a sectional view of the protective member shown in FIG. 2A.

FIG. 2A is a perspective view of a protective member 10 according to the preferred embodiment. The protective member 10 is composed mainly of a circular base 11 having substantially the same thickness and diameter as those of the wafer 1. As shown in FIG. 2B, a circular recess 12 having a given depth is formed on the front side of the base 11. The circular recess 12 has a diameter larger than the diameter of the device area 3 of the wafer 1 and smaller than the diameter of the wafer 1. The circular recess 12 is concentric with the outer circumference of the base 11, and an annular peripheral projection 13 is formed around the circular recess 12. The base 11 is formed of a hard material such as silicon, glass, and ceramic or a sheet material such as resin.

As shown in FIG. 2B, the recess 12 is filled with an unevenness absorbing member 14 in such a manner that the unevenness absorbing member 14 is flush with the peripheral projection 13. The unevenness absorbing member 14 is provided in the following manner. For example, after grinding the front side of the base 11 to form the recess 12, a sheet member as the unevenness absorbing member 14 is fitted into the recess 12 or a liquid resin is applied to the recess 12 and next cured to form the unevenness absorbing member 14.

The unevenness absorbing member 14 is formed of a flexible and resilient material such as resin and ceramic. The upper surface of the unevenness absorbing member 14 preferably has high flatness. More preferably, the material of the unevenness absorbing member 14 has heat resistance. Specific products of the unevenness absorbing member 14 may include Assist Tape (manufactured by Shin-Etsu Polymer Co., Ltd.), Flex Carrier (manufactured by UMI Inc.), Gel Base (manufactured by Exseal Corporation, Ltd.), and KERATHERM (registered trademark of KERAFOL Keramische Folien GmbH).

Figure 2C:
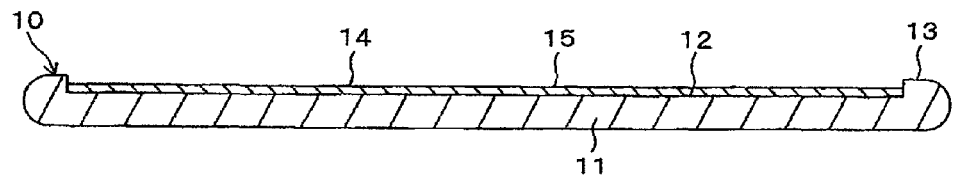
FIG. 2C is a sectional view showing a modification of the protective member.

There is a case that the unevenness absorbing member 14 provided in the recess 12 is lower in level than the peripheral projection 13 as shown in FIG. 2C. In this case, a recess 15 is formed on the front side of the protective member 10 because of the difference in level between the unevenness absorbing member 14 and the peripheral projection 13 as shown in FIG. 2C. In the case that electrode projections called bumps project from the front side of each device 2 of the wafer 1, the protective member 10 shown in FIG. 2C is used in the condition where the electrode projections are accommodated in the recess 15.

(3) Wafer Processing Method Using the Protective Member

There will now be described a preferred embodiment of the wafer processing method of grinding the back side 1b of the wafer 1 by using the protective member 10.

(3-1) Fixing Step

Figure 3:
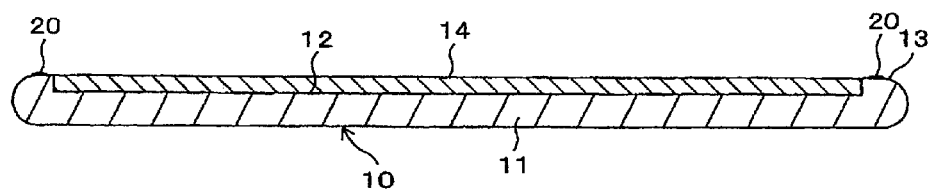
FIG. 3 is a sectional view showing a condition where an adhesive is provided on the protective member in a fixing step according to another preferred embodiment of the present invention.

As shown in FIG. 3, an adhesive 20 is provided on the front side of the annular peripheral projection 13 of the base 11 of the protective member 10. The adhesive 20 has a property of bonding the base 11 to the wafer 1 to fix the protective member 10 to the wafer 1. The adhesive 20 is continuously applied to the front side of the peripheral projection 13 over the circumference thereof. As a modification, the adhesive 20 may be discontinuously applied like a broken line or at given intervals (e.g., at four positions or at eight positions).

Preferably, the adhesive 20 has a property of reducing its adhesive strength when an external stimulus is applied to the adhesive 20. In the case that the adhesive 20 has this property, a removing step of removing the protective member 10 from the wafer 1 as hereinafter described can be easily performed. The external stimulus may include heating to a predetermined temperature and irradiation with ultraviolet radiation.

Figure 4:
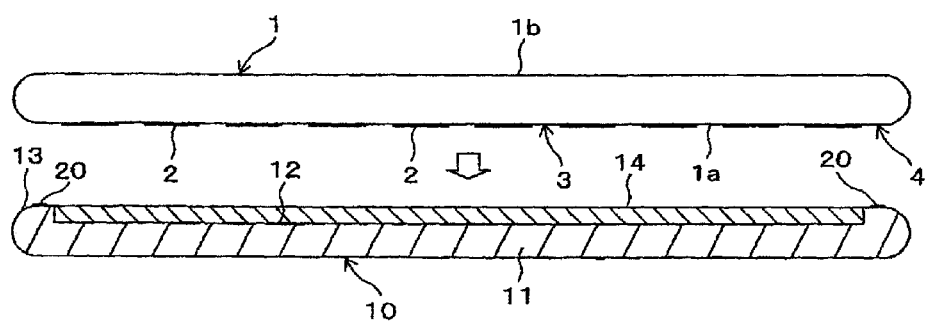
FIG. 4 is a partially sectional side view showing the fixing step.
Figure 5:
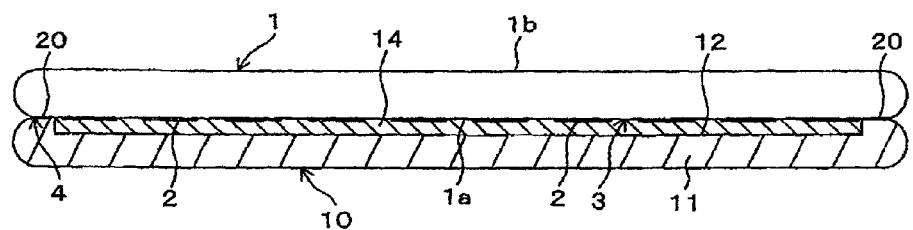
FIG. 5 is a partially sectional side view showing a condition where the fixing step is finished.

As shown in FIGS. 4 and 5, the wafer 1 is provided on the protective member 10 so that the device area 3 of the wafer 1 faces the unevenness absorbing member 14 of the protective member 10. In this condition, the wafer 1 is fixed to the protective member 10 by the adhesive 20. The adhesive 20 is preliminarily provided on the front side of the peripheral projection 13 surrounding the recess 12. Since the recess 12 is larger in diameter than the device area 3 of the wafer 1, the adhesive 20 is located outside of the device area 3 of the wafer 1 in the condition shown in FIG. 5. Further, the device area 3 of the wafer 1 faces the unevenness absorbing member 14 fitted in the recess 12, and each device 2 slightly projecting from the front side 1a of the wafer 1 is embedded in the unevenness absorbing member 14 in the condition shown in FIG. 5.

In the case that the electrode projections called bumps project from each device 2 of the wafer 1 as mentioned above, the protective member 10 having the recess 15 shown in FIG. 2C is used to fix the wafer 1 to the protective member 10 in the condition where the electrode projections are accommodated in the recess 15.

(3-2) Grinding Step

Figure 6:
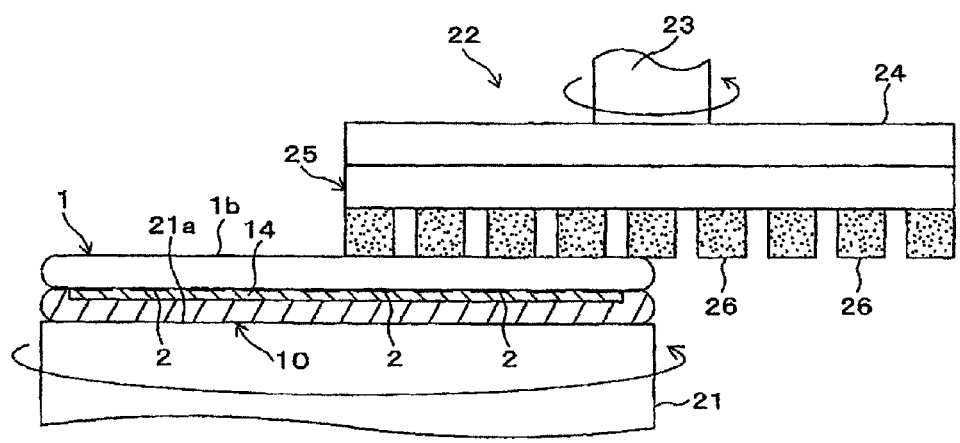
FIG. 6 is a partially sectional side view showing a grinding step according to the preferred embodiment.

After performing the fixing step as mentioned above, a grinding step is performed in the following manner. As shown in FIG. 6, the unit of the wafer 1 and the protective member 10 is held on a holding table 21 in the condition where the protective member 10 comes into contact with the holding table 21 and the back side 1b of the wafer 1 is exposed. In this condition, the back side 1b of the wafer 1 is ground by grinding means 22 to thereby reduce the thickness of the wafer 1 to a predetermined thickness (e.g., about 50 to 100 μm).

The holding table 21 is a vacuum chuck table generally known in the art. That is, the holding table 21 has a circular horizontal holding surface 21a formed of a porous material for holding a workpiece under suction by sucking air. The holding table 21 is rotatable about its axis by a rotational driving mechanism (not shown). The grinding means 22 includes a spindle 23 extending in a vertical direction and adapted to be rotationally driven by a motor (not shown), a flange 24 fixed to the lower end of the spindle 23, and a grinding wheel 25 fixed to the lower surface of the flange 24. The grinding means 22 is provided above the holding table 21 so as to be vertically movable. A plurality of abrasive members 26 are fixed to the lower surface of the grinding wheel 25 along the outer circumference thereof so as to be arranged annularly at given intervals. The abrasive members 26 are suitably selected according to the material of the wafer 1 as a workpiece. For example, the abrasive members 26 are provided by diamond abrasive members formed by bonding diamond abrasive grains with a bond such as metal bond and resin bond.

Figure 7:
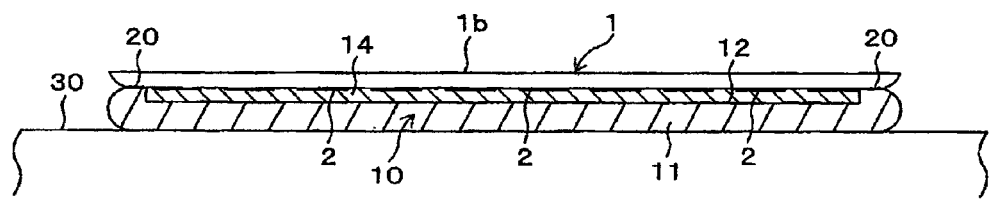
FIG. 7 is a partially sectional side view showing a removing step in the case that the adhesive is heated.

In the grinding step, the unit of the wafer 1 and the protective member 10 is placed on the holding table 21 in the condition where the protective member 10 is in contact with the holding surface 21a of the holding table 21. Thereafter, vacuum chuck is operated to hold the wafer 1 through the protective member 10 on the holding surface 21a of the holding table 21 under suction. Thereafter, the holding table 21 is rotated in one direction at a predetermined speed, and the grinding wheel 25 is also rotated in the same direction as the direction of rotation of the holding table 21. In this rotational condition, the grinding means 22 is lowered to bring the abrasive members 26 fixed to the grinding wheel 25 into contact with the back side 1b of the wafer 1 and then fed downward to grind the entire surface of the back side 1b of the wafer 1. In this preferred embodiment, the entire surface of the back side 1b of the wafer 1 is ground flat as shown in FIG. 7. As a modification, an outer circumferential portion of the back side 1b corresponding to the peripheral marginal area 4 formed on the front side 1a may be left in grinding to form a recess on the back side 1b in an area corresponding to the device area 3, from the viewpoints of suppressing the damage to the wafer 1 and ensuring the handleability of the wafer 1 after removing the protective member 10 from the wafer 1.

(3-3) Removing Step

Figure 8:
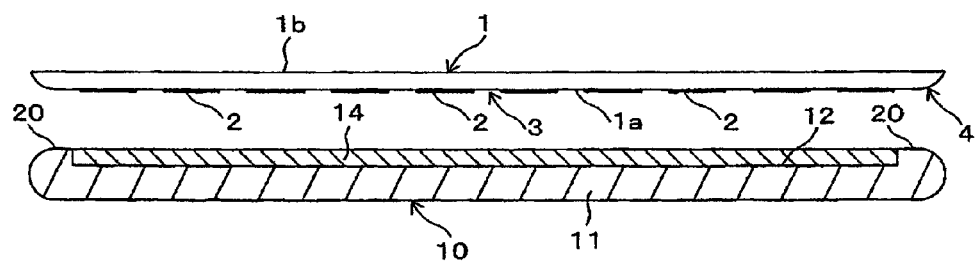
FIG. 8 is a partially sectional side view showing a condition where the removing step is finished.

After performing the grinding step as mentioned above, a removing step of removing the protective member 10 from the wafer 1 is performed in the following manner. In the case that the adhesive 20 is of a heat softening type such that its adhesive strength is reduced by heat, the unit of the wafer 1 and the protective member 10 is placed on a hot plate 30 in the condition where the protective member 10 comes into contact with the hot plate 30 as shown in FIG. 7, thereby heating the adhesive 20 to soften it. As a result, the adhesive strength of the adhesive 20 is reduced. Thereafter, the wafer 1 having a reduced thickness obtained by grinding the back side 1b in the grinding step is separated from the protective member 10 as shown in FIG. 8. In this manner, the protective member 10 is removed from the wafer 1, thus obtaining the wafer 1 processed by the grinding step.

Figure 9A:
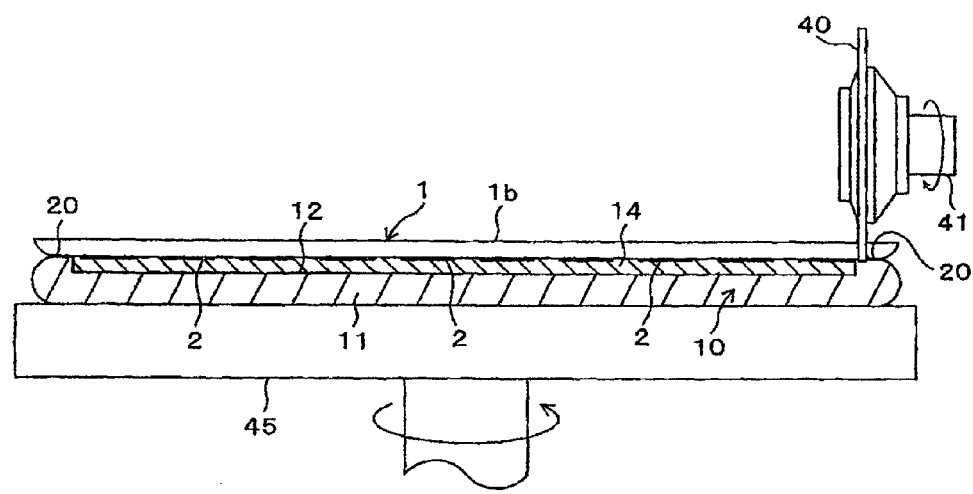
FIG. 9A is a partially sectional side view showing a modification of the removing step in the case that the wafer is cut by a cutting blade.

In the case that the adhesive 20 is of such a type that its adhesive strength is not reduced by the external stimulus, the wafer 1 is completely cut by a cutting blade 40 to obtain only the device area 3 as shown in FIG. 9A. In this case, the unit of the wafer 1 and the protective member 10 is held on a rotatable holding table 45 in the condition where the protective member 10 comes into contact with the holding table 45 and the back side 1b of the wafer 1 is therefore exposed as shown in FIG. 9A. In this condition, the holding table 45 is rotated to rotate the wafer 1, and the cutting blade 40 is positioned directly above the annular boundary between the device area 3 and the adhesive 20 and then cut into the wafer 1 along this annular boundary, thereby completely cutting the wafer 1 along this annular boundary.

Figure 9B:
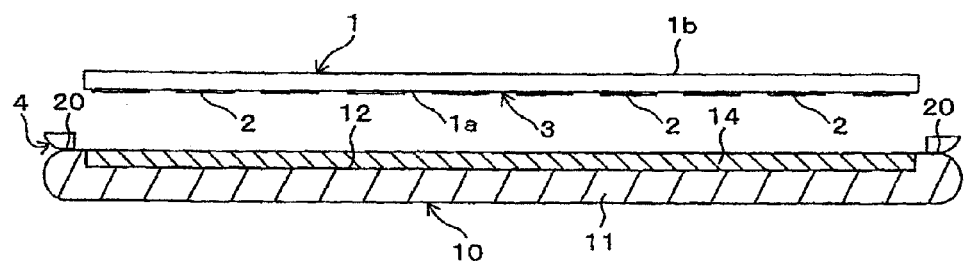
FIG. 9B is a partially sectional side view showing a condition where the removing step shown in FIG. 9A is finished.

The cutting blade 40 is mounted at the front end of a horizontally extending spindle 41. The spindle 41 extends above the holding table 45 so as to be axially movable and vertically movable. The wafer 1 is cut along the annular boundary inside of the adhesive 20. Accordingly, the device area 3 not bonded to the protective member 10 and facing the unevenness absorbing member 14 can be separated from the peripheral marginal area 4 bonded to the protective member 10 by the adhesive 20 as shown in FIG. 9B, thereby obtaining the wafer 1 (device area 3) processed by the grinding step. While the wafer 1 is cut by the cutting blade 40 in this preferred embodiment, a laser beam may be applied to the wafer 1 to cut the wafer 1.

(3-4) Modification of the Fixing Step

Figure 10A:
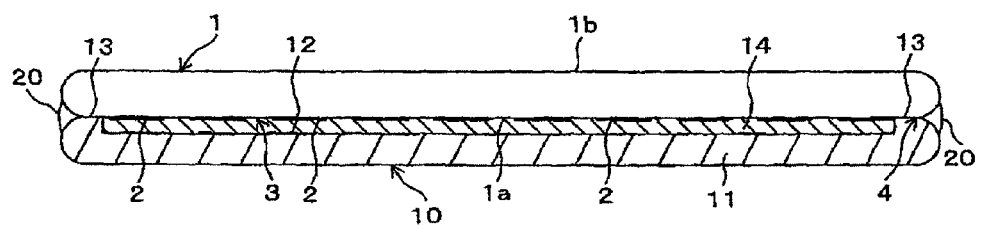
FIG. 10A is a partially sectional side view showing a modification of the fixing step in the case of using an adhesive having a property such that its adhesive strength is reduced by ultraviolet radiation.

As shown in FIG. 10A, the adhesive 20 may be applied to the outer circumferential surfaces of the wafer 1 and the protective member 10 stacked together rather than applied to the front side of the peripheral projection 13 of the protective member 10, thereby fixing the wafer 1 and the protective member 10. In this case, the adhesive 20 is applied continuously over the entire circumference of the wafer 1 and the protective member 10 or applied discontinuously at given intervals in the circumferential direction of the wafer 1 and the protective member 10 as required.

(3-5) Modification of the Removing Step

Figure 10B:
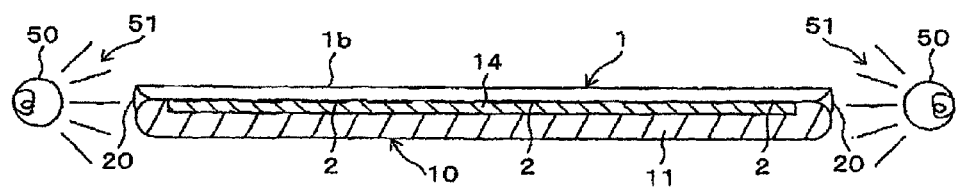
FIG. 10B is a partially sectional side view showing a modification of the removing step in the case shown in FIG. 10A.

In the case that the adhesive 20 shown in FIG. 10A is of a type such that its adhesive strength is reduced by irradiation with ultraviolet radiation, ultraviolet radiation applying means 50 is used as shown in FIG. 10B to apply ultraviolet radiation (external stimulus) 51 to the adhesive 20 in the removing step after the grinding step, thereby reducing the adhesive strength of the adhesive 20. Accordingly, the wafer 1 can be separated from the protective member 10. In this manner, the protective member 10 can be removed from the wafer 1, thus obtaining the wafer 1 processed by the grinding step.

Figure 11A:
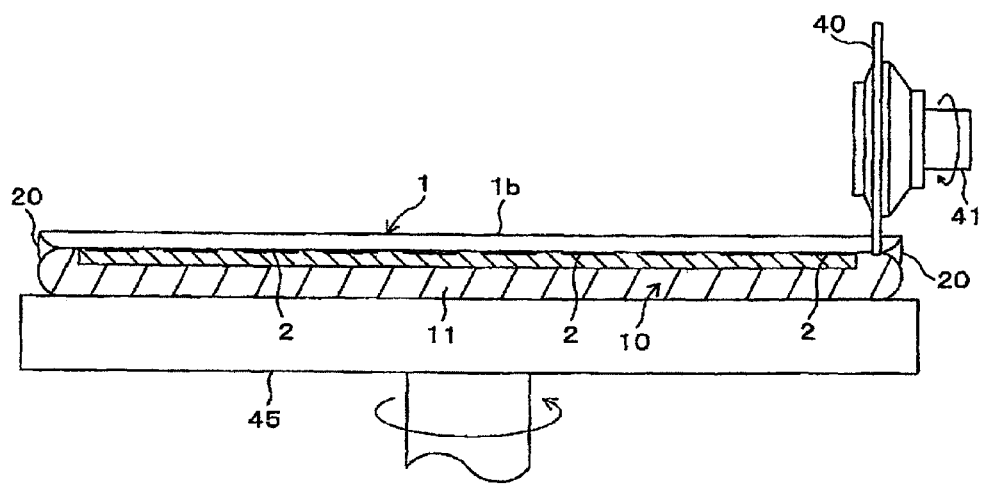
FIG. 11A is a partially sectional side view showing another modification of the removing step in the case of using an adhesive having a property such that its adhesive strength is not reduced by ultraviolet radiation and using a cutting blade for cutting the wafer.
Figure 11B:
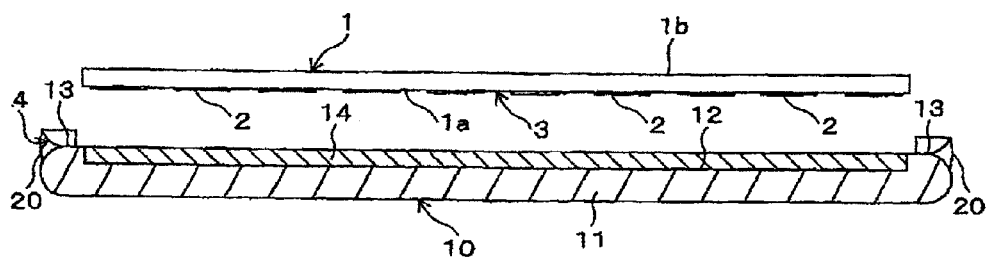
FIG. 11B is a partially sectional side view showing a condition where the removing step shown in FIG. 11A is finished.

In the case that the adhesive 20 shown in FIG. 10A is of a type such that its adhesive strength is not reduced by the external stimulus, the wafer 1 is completely cut by the cutting blade 40 to obtain only the device area 3 as shown in FIG. 11A. In this case, the unit of the wafer 1 and the protective member 10 is held on the holding table 45 in the condition where the protective member 10 comes into contact with the holding table 45 as shown in FIG. 11A. In this condition, the holding table 45 is rotated to rotate the wafer 1, and the cutting blade 40 is cut into the wafer 1 along the annular boundary between the device area 3 and the adhesive 20, thereby completely cutting the wafer 1 along this annular boundary. Accordingly, the device area 3 not bonded to the protective member 10 and facing the unevenness absorbing member 14 can be separated from the peripheral marginal area 4 bonded to the protective member 10 by the adhesive 20 as shown in FIG. 11B, thereby obtaining the wafer 1 (device area 3) processed by the grinding step. As a modification, a laser beam may be applied to the adhesive 20 to evaporate the adhesive 20, thereby removing the adhesive 20. Accordingly, the protective member 10 can be removed from the wafer 1.

(4) Effects of this Preferred Embodiment

According to this preferred embodiment, the adhesive 20 is locally provided outside of the device area 3 to fix the protective member 10 and the wafer 1. In this fixed condition, the device area 3 faces the unevenness absorbing member 14. Accordingly, after grinding the back side 1b of the wafer 1, the protective member 10 can be easily removed from the wafer 1. Furthermore, the adhesive 20 is not left on the front side 1a of the wafer 1 after removing the protective member 10.

Further, the wafer support system mentioned above is attached to a wafer by using an attaching apparatus and removed from the wafer by using a removing apparatus. However, these dedicated apparatuses are large in size and expensive in general. In addition, much time is required to perform the steps of attaching and removing the wafer support system by using these dedicated apparatuses. To the contrary, this preferred embodiment has an advantage such that these dedicated apparatuses are not required in attaching the protective member 10 to the front side 1a of the wafer 1 and removing the protective member 10 from the front side 1a of the wafer 1. Furthermore, the time required for the steps of attaching and removing the protective member 10 can be shortened.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of processing a wafer by using a protective member, a front side of said wafer having a device area where a plurality of devices are formed and a peripheral marginal area surrounding said device area, said protective member including a circular base having a diameter greater than or equal to the diameter of said wafer, a front side of said circular base being formed with a recess larger in size than said device area and smaller in size than said wafer, and an unevenness absorbing member provided in said recess, said wafer processing method comprising:

a fixing step of providing said wafer on said protective member so that said device area of said wafer faces said unevenness absorbing member of said protective member and providing an adhesive outside said device area to thereby fix said protective member and said wafer;

a grinding step of holding said protective member on a holding table in the condition where the back side of said wafer is exposed after performing said fixing step, and next grinding the back side of said wafer by using grinding means to thereby reduce the thickness of said wafer to a predetermined thickness; and a removing step of removing said protective member from said wafer after performing said grinding step, wherein said adhesive has a property such that its adhesive strength is reduced by an external stimulus; and said removing step includes the steps of applying said external stimulus to said adhesive to thereby reduce the adhesive strength of said adhesive and next removing said protective member from said wafer.

2. The wafer processing method according to claim 1, wherein said removing step includes the steps of completely cutting at least said wafer along the boundary between said device area and said adhesive and next removing said protective member from said wafer.

* * * * *